(12) United States Patent
Ararao (10) Patent No.: US 9,102,511 B2
(45) Date of Patent: Aug. 11, 2015

(54) HERMETIC PLASTIC MOLDED MEMS DEVICE PACKAGE AND METHOD OF FABRICATION

(71) Applicant: TEXAS INSTRUMENTS INCORPORATED, Dallas, TX (US)

(72) Inventor: Virgil C. Ararao, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 247 days.

(21) Appl. No.: 13/914,013

(22) Filed: Jun. 10, 2013

(65) Prior Publication Data

US 2013/0328141 A1   Dec. 12, 2013

Related U.S. Application Data

(60) Provisional application No. 61/657,355, filed on Jun. 8, 2012.

(51) Int. Cl.
*B81C 1/00* (2006.01)
*B81B 7/00* (2006.01)

(52) U.S. Cl.
CPC ........... *B81B 7/0032* (2013.01); *B81C 1/00261* (2013.01); *B81C 1/00333* (2013.01); *B81C 2203/0109* (2013.01); *B81C 2203/019* (2013.01)

(58) Field of Classification Search
None
See application file for complete search history.

(56) References Cited

U.S. PATENT DOCUMENTS

| | | | | | |
|---|---|---|---|---|---|
| 5,798,557 | A | * | 8/1998 | Salatino et al. | 257/416 |
| 5,919,364 | A | * | 7/1999 | Lebouitz et al. | 210/321.84 |
| 5,936,758 | A | * | 8/1999 | Fisher et al. | 359/224.1 |
| 6,335,224 | B1 | * | 1/2002 | Peterson et al. | 438/114 |
| 6,630,725 | B1 | * | 10/2003 | Kuo et al. | 257/659 |
| 2001/0055836 | A1 | * | 12/2001 | Kunda | 438/108 |
| 2004/0048449 | A1 | * | 3/2004 | Amiotti | 438/471 |
| 2004/0104460 | A1 | * | 6/2004 | Stark | 257/678 |
| 2006/0006523 | A1 | * | 1/2006 | Coyle et al. | 257/704 |
| 2007/0117275 | A1 | * | 5/2007 | DCamp et al. | 438/127 |
| 2009/0115007 | A1 | * | 5/2009 | Hong | 257/415 |
| 2009/0140413 | A1 | * | 6/2009 | Wang et al. | 257/698 |

OTHER PUBLICATIONS

Zhang et al., U.S. App. No. 13/787,198, filed Mar. 6, 2013, Plastic-Packaged Semiconductor Device Having Wires With Polymerized Insulator Skin.
Ararao, Virgil, U.S. Appl. No. 13/671,734, filed Nov. 8, 2012, Hermetically Sealed MEMS Device and Method of Fabrication.

* cited by examiner

*Primary Examiner* — Anthony Ho
*Assistant Examiner* — Samuel Lair
(74) *Attorney, Agent, or Firm* — Jacqueline J. Garner; Frank D. Cimino (57) ABSTRACT

A hermetically packaged microelectromechanical system (MEMS) device has a substrate with an assembly pad (101) and a plurality of terminals (102); a chip (110) with a MEMS mechanical element (111) of a first height (111*a*) assembled on the pad and connected to the terminals by wires (120) with an insulating coat (121); a ridge (130) on the substrate, which surrounds the MEMS element (111) with a second height (130*c*) greater than the first height and comprises a plastic compound (131) filled with particles (132) and a surface (130*a*, 130*b*) having an adhering moisture-impermeable seal layer (133); and a moisture-impervious lid (140) attached to the ridge by moisture-proof bonds (150, 151), sealing the volume (160) enclosed by the lid, the chip, and the metalized ridge as a hermetic space for the MEMS element (111).

13 Claims, 4 Drawing Sheets

HERMETIC PLASTIC MOLDED MEMS DEVICE PACKAGE AND METHOD OF FABRICATION

This application claims the benefit of U.S. Provisional Application No. 61/657,355 filed Jun. 8, 2012, the entirety of which is incorporated herein by reference.

BACKGROUND

This relates to semiconductor devices and processes, and more specifically to the structure and fabrication of hermetic plastic packages for microelectromechanical system (MEMS) devices.

The wide variety of products collectively called microelectromechanical system (MEMS) devices are small, lightweight devices on the micrometer to millimeter scale, which may have mechanically moving parts and often movable electrical power supplies and controls, or they may have parts sensitive to thermal, acoustic, or optical energy. MEMS devices have been developed to sense mechanical, thermal, chemical, radiant, magnetic, and biological quantities and inputs, and produce signals as outputs. Because of the moving and sensitive parts, MEMS devices have a need for physical and atmospheric protection. Therefore, MEMS devices are supported on a substrate and surrounded by a housing or package, to shield the MEMS components against ambient and electrical disturbances, and against stress.

A MEMS device integrates mechanical elements, sensors, actuators, and electronics on a common substrate. The manufacturing approach for a MEMS device aims at using batch fabrication techniques similar to those used for other microelectronics devices. Such devices can thus benefit from mass production and minimized material consumption to lower the manufacturing cost, while trying to exploit the well-controlled integrated circuit technology.

Example MEMS devices include mechanical sensors, both pressure sensors including microphone membranes, and inertial sensors such as accelerometers coupled with the integrated electronic circuit of the chip. The mechanically moving parts of a MEMS devices are fabricated together with the sensors and actuators in the process flow of the electronic integrated circuit (IC) on a semiconductor chip. The mechanically moving parts may be produced by an undercutting etch at some step during the IC fabrication. Examples of specific bulk micromachining processes employed in MEMS sensor production to create the movable elements and the cavities for their movements are anisotropic wet etching and deep reactive ion etching.

MEMS device packages do not generally have to be hermetic, i.e., impermeable to water molecules. Consequently, typical MEMS devices may use sealants made of polymeric compounds. Some MEMS devices do, however, require hermetic packages. Example of devices requiring hermetic packages include digital micromirror devices (DMDs), such as the DLP® DMD devices available from Texas Instruments. A typical DMD includes an array of individually addressable light modulating pixel element micromirrors, the reflectors of each of which are selectively positioned to reflect or not to reflect light to a desired site.

Conventional hermetic packaging of MEMS devices usually involves a packaging process that departs from the processes normally used for non-MEMS device packaging. MEMS hermetic packaging is expensive not only because the package often includes a ceramic material, or a metallic or glass lid, but also because the package must be configured to avoid contact with moving and other sensitive parts of the MEMS device and to further allow a controlled or reduced atmosphere inside the package. The high package cost is, however, in conflict with market requirements for many applications of MEMS devices, which put a premium at low device cost and, therefore, low package cost. Further, the conventional fabrication of hermetic MEMS packages also encounters many technical challenges, such as those caused by potentially high temperatures in connection with welding of a hermetic lid to the package base. As an example, a recently proposed package with a sealing process using a glass core involves temperatures considerably above 450° C., typically between 525 and 625° C. dependent on the sealing glass selected. These temperature ranges are a risk for the reliability of silicon integrated circuits and for proper functioning of many MEMS device components.

There is a need for low cost hermetic packaging of MEMS devices.

SUMMARY

Structures and processes are disclosed for hermetically sealed microelectromechanical systems (MEMS) devices.

DETAILED DESCRIPTION OF EXAMPLE EMBODIMENTS

Figure 1:
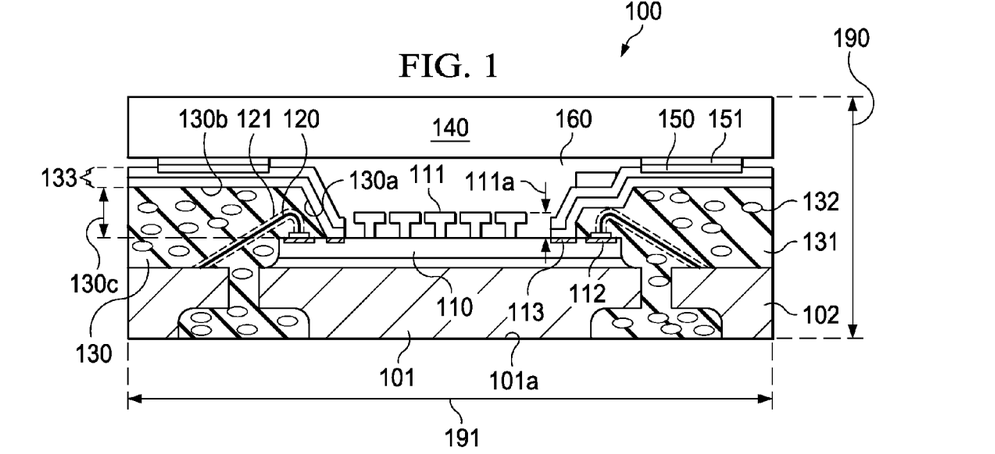
FIG. 1 is a cross-sectional view of an example embodiment of a hermetically packaged microelectromechanical system (MEMS) device.

FIG. 1 illustrates an example embodiment of a hermetically packaged microelectromechanical system (MEMS) device 100.

Device 100 has a metallic leadframe substrate comprising a pad 101 and leads 102. A semiconductor chip 110 is attached to leadframe pad 101. Chip 110 may be an integrated circuit die chip that includes MEMS micromechanical components 111 which extend to a first height 111a above an upper surface of the chip. The components 111 may, for example, be movable micromechanical elements such as position-settable mirrors of a digital micromirror device (DMD). Chip 110 may be made of silicon, silicon germanium, gallium arsenide, III-V compounds, or any other material used in integrated circuit or microelectronic technology. Chip 110 may be used without backgrinding (between about 0.4 and 0.9 mm thick). Chip 110 has a plurality of bondable terminal pads 112. The terminal pads 112 may be metal such as aluminum or copper, or any other material to which conductive connectors may be affixed. Pads 112 are connected to respective leads 102 by metallic bonding wires 120, which may be coated with an insulating layer 121.

Figure 2A:
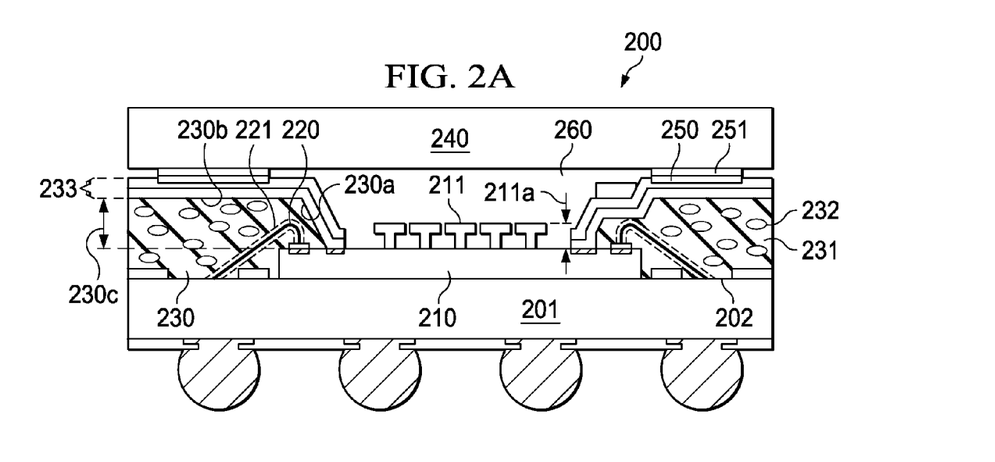
FIGS. 2A and 2B are cross-sectional views of other example embodiments of hermetically packaged MEMS devices.
Figure 2B:
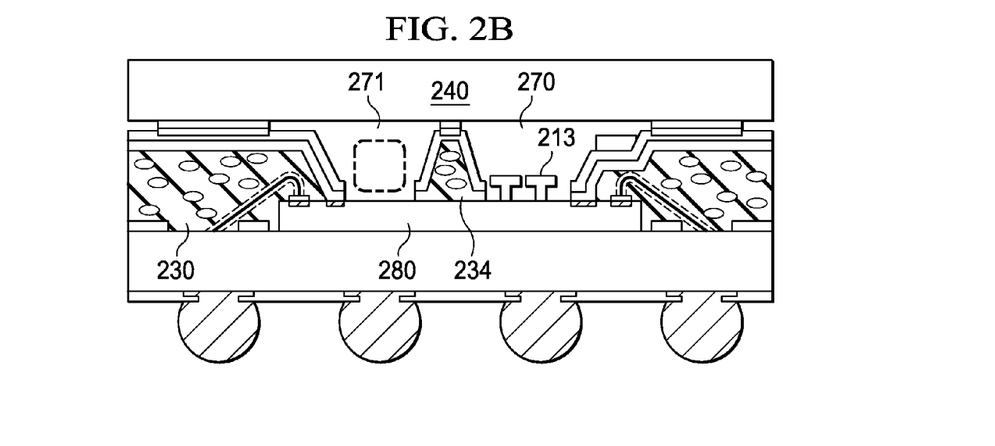

The substrate may be a metal leadframe, as shown in FIG. 1, or a multimetal-level substrate, laminated substrate, or any other suitable support structure, as shown in FIGS. 2A and 2B. When the substrate is a leadframe, the metal is preferably copper or a copper alloy. Alternative metal selections include aluminum, iron-nickel alloys, and Kovar™ material. One or more surfaces 101a of the leadframe may be prepared to facilitate solder attachment, for instance by a sequence of plated layers of nickel, palladium, and gold. In addition, the one or more surfaces may have a metal layer deposited to enhance thermal conductivity, for instance by a plated layer of silver. Preferred thickness of the leadframe metal for the example embodiment shown in FIG. 1 is 0.2 mm; other embodiments may use thinner or thicker (e.g. 0.5 mm) leadframe metal. From the standpoint of low cost and batch processing, it is preferred to start with a strip of flat sheet of metal and fabricate pad and leads by stamping or etching. Pad 101 may stay in the plane of the flat sheet, or it may be offset for facilitating assembly and wire bonding processes. Leads 102 may retain the flatness of the sheet, as in QFN and SON packages, or they may be formed as cantilever leads with spring-like characteristics. The assembly and packaging process flow is concluded by singulating the strip into discrete units.

As FIG. 1 depicts, bonding wires 120 span the distance from chip terminals 111 to respective substrate leads 102 in some sort of arc. In the example of FIG. 1, ball bonding is used; alternatively double-stitch bonding or ribbon bonding may be employed. The conventionally preferred gold wires are recently more and more replaced by wires made of lower cost metals such as copper or aluminum. The common trend is to miniaturize the distance between adjacent wire arcs by selecting a finer pitch center-to-center of the chip bond pads (for instance from 70 µm to 35 µm) and reducing the diameter of the wires (for instance from 30 µm to 20 µm). The miniaturization trend continues in spite of the fact the stiffness of the bonded wires and thus the robustness of the wire spans are decreased, even for specially alloyed or heat treated wires. For example, the stiffness of 20 µm and 15 µm diameter wires is 41% and 13%, respectively, of a 25 µm diameter wire.

Figure 4:
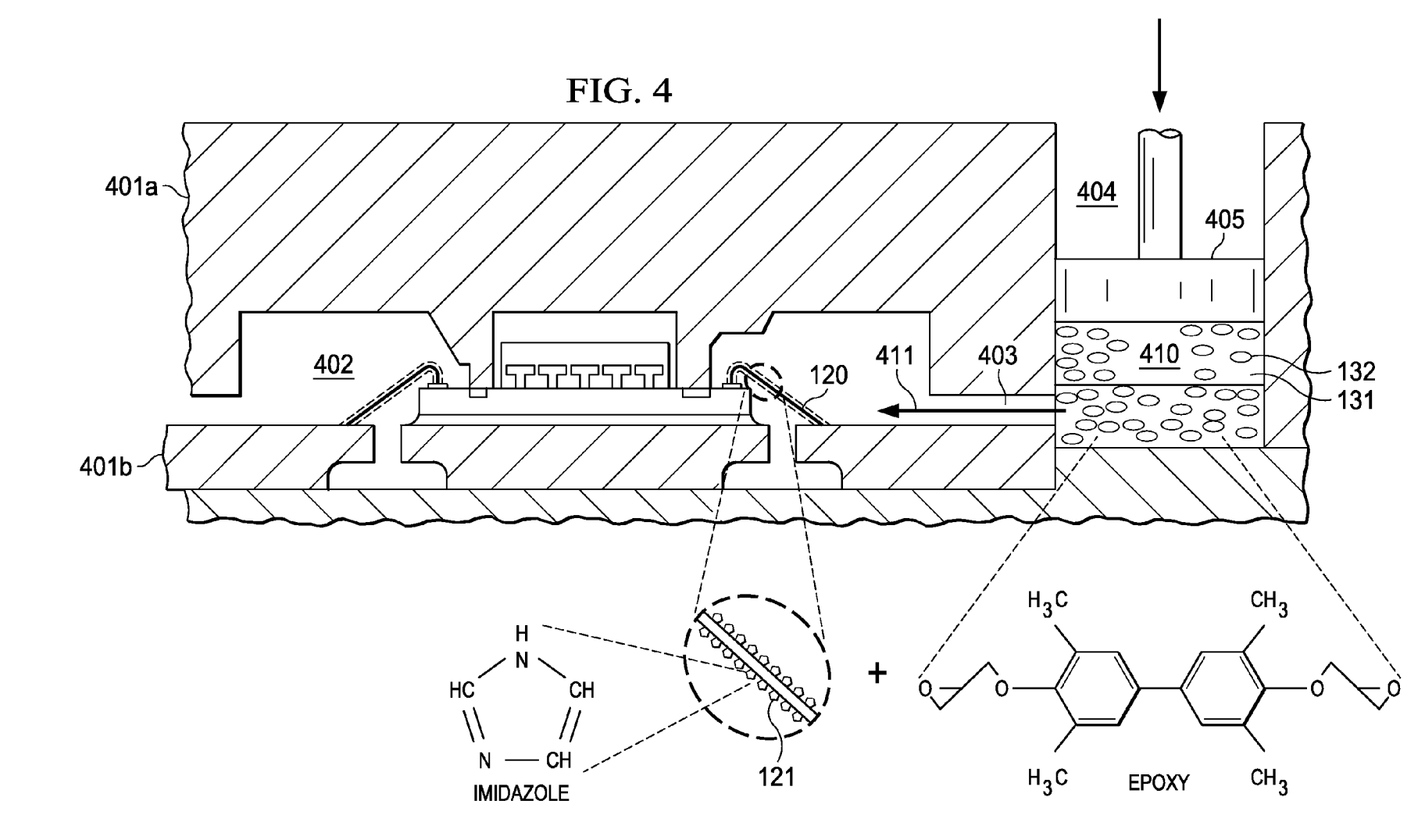

FIG. 1 shows that the surfaces of the wire arcs may be coated with a layer of a heterocyclic compound; the coating layers are designated 121. After completing the wire-bonding operation proper, automated bonders (for example, like those available from Kulicke & Soffa, Fort Washington, Pa.) offer on-bonder dispense systems which allow the dispensing of liquids over just-completed wire spans. An example liquid consists of a solution of about 1 millimole per liter (mmol/L) of a heterocyclic compound in ethanol. In the dispensing step, a layer of liquid is formed on the wire surfaces. The ethanol will be evaporated after dispensing, while at least one monolayer 121 of the heterocyclic compound remains adsorbed on the wire surfaces. The adsorbed layer 121 is shown in the insert of FIG. 4 by the enlargement of a wire portion 120a. The preferred heterocyclic compound is imidazole; after being adsorbed on the surfaces of wire 120, imidazole can act as catalyst for polymerizing epoxy-type long-chain molecules.

As the example embodiment of FIG. 1 illustrates, the substrate, exemplified by the leadframe with pad 101 and leads 102, has a ridge 130 formed by a plastic compound 131 filled with particles 132 and covered on its surface by a metalized layer 133. Preferred choices for compound 131 include a polymerizable epoxy-based resin and silicone. Compound 131 provides the supporting body of the package for device 100 by connecting pad 101 and leads 102 and defining the shape of the device package. Compound 131 forms the ridge 130 so that the ridge fully surrounds the MEMS elements and has a slope 130a extending from ridge top 130b towards the MEMS elements. Top 130b of the ridge has a second height 130c relative to chip surface 110. Second height 130c is greater than the first height 111a. Slope 130a may be quite steep, but preferably is less inclined than vertical. Furthermore, compound 131 encloses the wires 120.

The filler particles 132 of plastic compound 131 may be electrically insulating or electrically conductive. As for insulating fillers, preferred materials include particles of silicon dioxide and silicon carbide. As for conductive fillers, preferred materials include particles made of metals such as silver and copper, and of compounds such as nickel-graphite and carbon fibers. When conductive fillers are employed, wire insulations 121 are preferably used. The percent of filler particles 132 in a volume of compound 131 may vary widely; the volume content of insulating fillers may reach between 80% and >90%. A suitable method of applying the compounds is transfer molding; alternative methods are becoming popular in the semiconductor industry. Preferably, the filler particles have a diameter of about 1 to 10 µm and are preferably approximately spherical, since particles with sharp corners may be abrasive to the precision steel surfaces and gates of molding equipment.

On the surface 130a and 130b of the ridge is a metallized layer 133, the ends of which are sealed to chip metal ring 113 surrounding the MEMS; layer 133 can be manufactured by several methods. In one method, the whole surface of the ridge 130, including slope 130a, is activated by etching the surface in a concentrated acid, which roughens the ridge surface but does not attack the resist protecting the MEMS at this stage of the packaging process flow. In another activation method, the ridge surface is activated by ion bombardment or by exposure to a plasma discharge. After one of these activation steps and without delay, a layer of metal, such as palladium, is deposited, preferably by plating, on the activated surface. The resulting metal layer is impervious to moisture and adheres to the compound surface.

An alternative method for forming a metalized layer 133 on the ridge surface uses a deformable seal film. Preferably, this film includes a foil of polyimide between about 5 µm and 10 µm thick laminated with an adhering metal foil, also between about 5 µm and 10 µm thick. The seal film lines the surface of ridge top 130b and slope 130a, but is non-adhering to the steel mold employed for the molding step (see below).

The example embodiment of FIG. 1 further exhibits a moisture-impervious lid 140. For MEMS device 100, lid 140 is flat, parallel to the orientation of the MEMS, and transparent to visible light; a suitable lid is made of glass. In other embodiments, lid 140 may be made of silicon transmissible to infrared wavelengths. For still other embodiments, lid 140 may be dome-shaped. In all examples, lid 140 is attached to the metalized layer 113 on ridge top 130b by moisture-proof bonds. Preferred bonds may include a layer 150 of metal and a layer 151 of intermetallic compounds. An example of fabricating such preferred moisture-proof bonds is described below.

Depending on the thickness of lid 140, the overall thickness 190 of example device 100, especially as a package for digital micromirror devices (DMDs), may be in the range from about 1.5 mm to 3.0 mm. Examples of lateral dimensions for device 100 in FIG. 1 are about 14 mm as length 191 and about 5 mm as width (not shown in FIG. 1).

As a result of the structure and materials of the package shown in FIG. 1, the volume 160 enclosed by lid 140, chip 110, and metalized ridge 130a and 130b is sealed as a hermetic space for MEMS components 111.

FIGS. 2A and 2B illustrate other example embodiments of a sealed volume suitable as hermetic space for MEMS components, wherein the embodiments are based on metal/insulator laminated or tape substrates, which offer greatly increased numbers of input/output terminals compared to leadframe-based devices. In both examples, the hermetic volume is enclosed by a chip, a lid, and a metalized plastic ridge; the ridge rests on the metal/insulator laminated or tape substrate.

For packaged MEMS device 200 depicted in FIG. 2A, the hermetic space 260 is constructed analogous to the space 160 of FIG. 1: The substrate 201, in FIG. 2A based on laminate or tape, has an assembly pad and a plurality of terminals 202. A chip 210 with MEMS movable elements 211 extending to a first height 211a above the chip surface is assembled on the pad and connected to the terminals by wires 220 with an insulating coat 221. Attached to the substrate is a ridge 230, which surrounds the movable elements and has a second height 230c (for instance, between about 0.15 and 0.3 mm) measured from the chip surface, greater than the first height. The ridge comprises a plastic compound 231 filled with particles 232, which may be electrically insulating or conductive. The surface 230a, 230b of the ridge is metalized. It may have a plated layer of metal, or may have an adhering moisture-impermeable seal film 233. A moisture-impervious lid 240 is attached to the ridge by moisture-proof bonds 250, 251, sealing the volume 260 enclosed by the lid, the chip, and the metalized ridge as a hermetic space for the MEMS elements.

FIG. 2B illustrates another example embodiment based on a metal-insulator laminate or tape. The embodiment features two separate sealed cavities 270 and 271; one cavity may be suitable as a hermetic space for MEMS movable components 213, and the other cavity may be a hermetic space for another component such as a stack of chips, a sensor, and a passive component. As FIG. 2B shows, both spaces together are enclosed by a common chip 280 and a common lid 240, and a plurality of plastic ridges 230 and 234 with metalized surfaces.

FIGS. 3-9 illustrate steps in an example process for fabricating hermetic plastic molded MEMS packages using leadframe-based substrates. It should be stressed, however, that analogous process steps are applicable to packages using substrates based on laminates or tapes. FIG. 10 displays a process step for a device using a laminate- or tape-based substrate.

Figure 3:
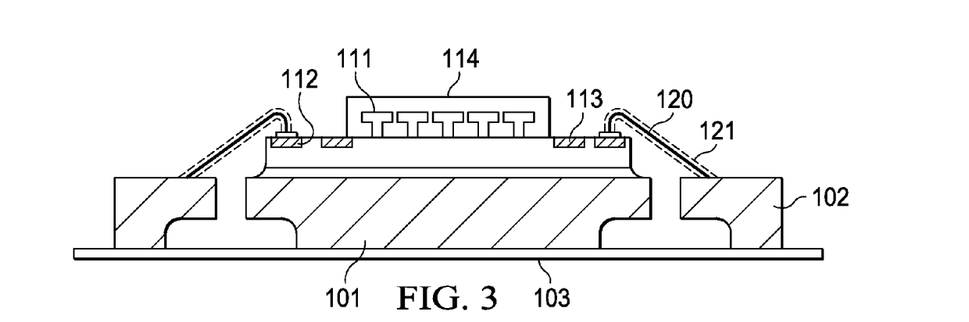
FIGS. 3-9 illustrate steps in example methods for fabricating hermetic MEMS device packages.

In FIG. 3, a strip of leadframes is placed on a heatable work plate. Alternatively, the leadframe strip may be placed on a laminated tape 103 to protect against mold bleeding and plating damage in later process steps. FIG. 3 depicts a leadframe of the strip, including chip attachment pad 101 and a plurality of leads 102. A chip 110 is attached, for instance by an adhesive epoxy, to pad 101. Chip 110 includes MEMS movable elements 111, which at this stage are supported by protective material 114. An example of protective material is a layer of photoresist. Chip 110 further includes a plurality of metallic terminals 112 and, for certain MEMS devices, a metallic ring 113 surrounding the MEMS elements.

FIG. 3 illustrates the process step of connecting the chip terminals 112 with the leadframe leads 102 by bonding wires 120. A preferred connecting method is ball bonding, which spans the wire in an arc between terminal and lead. When the later encapsulation step will use a polymeric compound with electrically conducting fillers, the bonding wires are preferably surrounded with an electrically insulating skin right after the bonding step. Further details of such a method are disclosed in U.S. application Ser. No. 13/787,198, filed 6 Mar. 2013, the entirety of which is incorporated herein by reference.

As mentioned above, automated bonders offer on-bonder dispense systems which allow the dispensing of liquids over just-completed wire spans. An example liquid consists of a solution of about 1 millimole per liter (mmol/L) of a heterocyclic compound in ethanol. In the dispensing step, a layer of liquid is formed on the wire surfaces. The ethanol will be evaporated after dispensing, while at least one monolayer 121 of the heterocyclic compound remains adsorbed on the wire surfaces. The preferred heterocyclic compound is imidazole (see inset of FIG. 4); after being adsorbed on the surfaces of wire 120, imidazole can act as catalyst for polymerizing epoxy-type long-chain molecules.

By way of explanation, a heterocyclic compound has a five-membered ring, which includes besides carbon atoms other atoms such as nitrogen, oxygen, or sulfur. The heterocyclic compounds preferred for this process step have at least one nitrogen atom. The basic compound is pyrrole ($C_4H_5N_1$) with a five-membered di-unsaturated ring and one nitrogen atom. Pyrazole ($C_3H_4N_2$) has two adjacent nitrogen atoms as part of the ring. Isomeric with pyrazole is imidazole ($C_3H_4N_2$), which has two non-adjacent nitrogen atoms as part of the ring. As catalyst, imidazole is the preferred compound for the present process step (see inset of FIG. 4). An alternative to the preferred imidazole is triazole ($C_2H_3N_3$), containing a five-membered ring with three nitrogen atoms as part of the ring.

Next process steps are summarized in FIG. 4. The leadframe together with the attached and wire-bonded chip, with the layers 121 of heterocyclic compound adsorbed on the wire surfaces, is loaded into the cavity 402 of a steel mold suitable for the transfer molding process flow. The mold consists of a top half 401a and a bottom half 401b. The top half 401a has been designed to create on the substrate (leadframe) a ridge (designated 130 in FIG. 1) surrounding the MEMS and having a height greater than the height of the MEMS elements. Both mold halves are preheated to a temperature between ambient temperature and the liquefying temperature of the pellet. After placing the assembly on the bottom half 401b of the cavity, the top mold half 401a is closed, whereby the preheated cavity 401 is connected by a preheated runner 403 with the preheated pressure chamber 404.

Solid pellets 410 of the packaging compound 131 are then loaded into the preheated pressure chamber 404. The number of pellets may vary according to the number of cavities to be filled by the transfer step. The top pellet is weighed down by movable plunger 405, which can be activated to pressure the packaging material into the cavity after liquefying the pellets.

In a preferred packaging material for transfer-molded devices, each pellet is composed of an epoxy-type resin, or another suitable thermoset compound, and about 80 to 90 weight % filler grains 132. For electrically insulating fillers, preferred materials include particles of silica, silicon dioxide silicon carbide, alumina trihydrate, and glass fibers. For electrically conductive fillers, preferred materials include particles made of metals such as silver and copper, and of compounds such as nickel-graphite and carbon. In addition, molding compounds may also include coupling agents, hardeners, flame retardants, mold release agents, and curing agents to convert the resin into a cross linked (polymerized) structure.

The preheating time for conventional molds is about 40 s. After solid pellets 410 have been loaded into pressure chamber 404, the temperature of the chamber is increased to reach the temperature of low viscosity (liquefying) of the resin, preferably 175° C. The time interval needed to raise the temperature of the solid pellets 410 to the liquefying temperature is preferably between about 5 s and 6 s, dependent on the mold employed; in automolds, the time is between about 2 s and 3 s. The transfer to cavity 402 of the liquefied resin takes about 18 s to 30 s in conventional molds, dependent on the transfer speed, and about 8 s to 10 s in automolds (at 3 mm/s transfer speed). During the time interval (melting time plus transfer time), the vapor 411 of the resin molecules can spread during melting time and be pushed during transfer time from chamber 410 through runner 403 to cavity 402, where the vapor distributes throughout the cavity, reaching the semiconductor assembly inside the cavity, where the assembly includes the bonding wires with the surfaces covered by the adsorbed heterocyclic compound molecules.

When the resin molecules arrive in cavity 402 and reach the wires with the surfaces covered by the adsorbed heterocyclic compound molecules, the resin molecules are cross-linked into at least a monolayer 121 of polymeric structure on the wire surfaces, whereby the adsorbed heterocyclic compound molecules act as catalysts. For most molds, the time interval and the polymerization speed are sufficient to form a layer of polymerized molecules on the wire surfaces with an effective thickness of several monolayers. The insulating characteristic of the polymerized layer is enhanced by the insulating quality of the surface coating with catalyst heterocyclic molecules.

Figure 5:
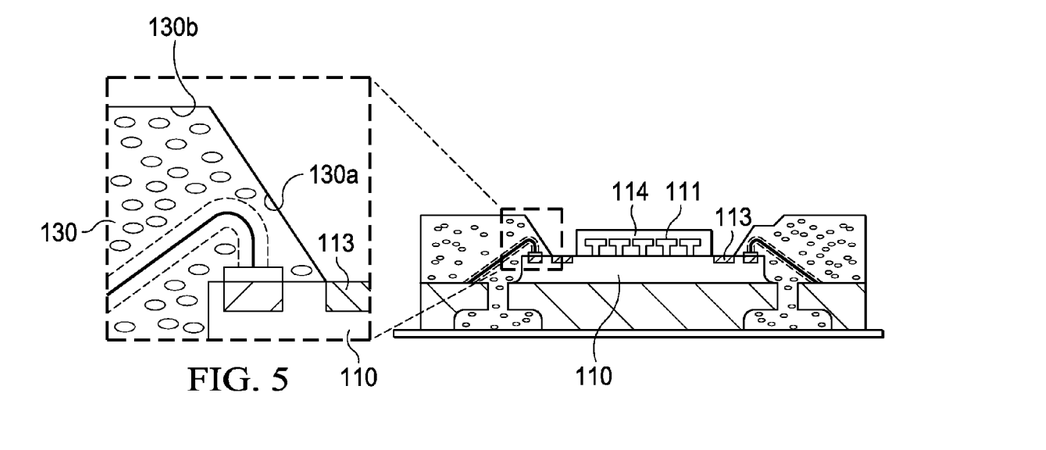
Figure 6:
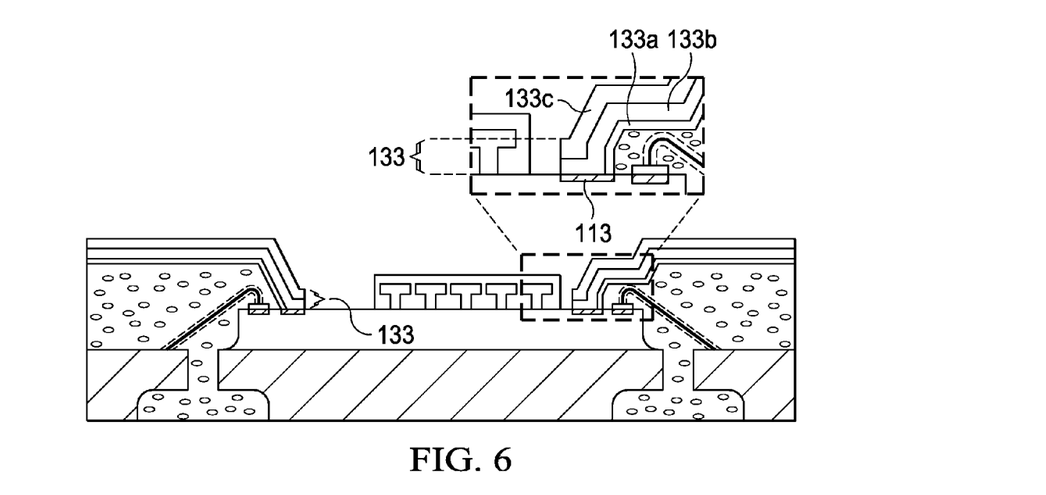

The semi-viscous polymeric resin progresses controlled in a steady wave front until cavity 402 is completely filled with resin. Supported by the curing agent, the resin is allowed to partially polymerize in the cavity while the temperature of the mold is lowered so that the cavity can be opened by lifting the top mold half 401a. After allowing the temperature to cool further, the encapsulated assembly can be removed from the cavity. FIG. 5 illustrates the device at this stage.

In a next process step, the surfaces 130a and 130b of the molded ridge 130 are metalized by one of several methods. In the first phase, the ridge surface may be activated, for instance by etching the surface in a concentrated acid, which roughens the ridge surface but does not attack the resist 114 protecting the MEMS elements 111, or by bombarding the surface with ions or exposing is to a plasma discharge. As FIG. 6 indicates, after one of these activation steps and without delay, a seed layer 133a of metal, such as palladium or tin, is deposited, preferably by plating, on the activated surface. Then, a layer 133b of electroless nickel or electroless copper is plated, followed by a layer 133c if electrolytic copper. The resulting metal layer 133 is impervious to moisture, adheres to the compound surface 130a and 130b, and is sealed in contact with chip metal ring 113. The metal of layer 133 is referred to herein as first metal.

Figure 7:
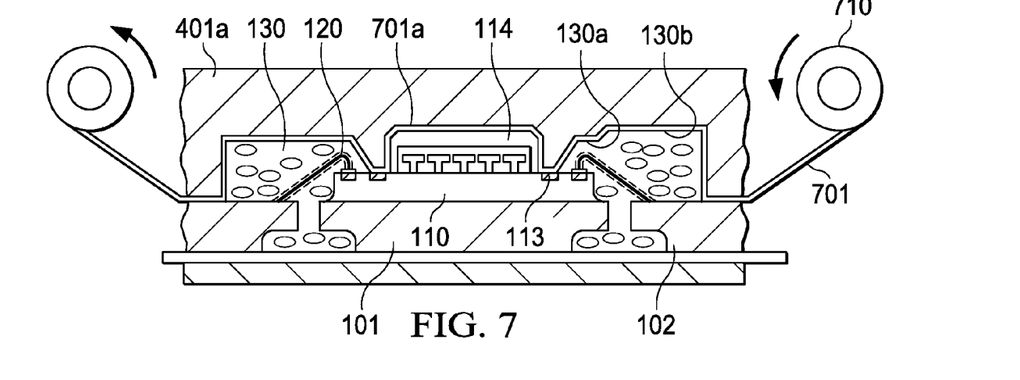

Alternatively, the metallization of the plastic surface can be combined with the molding process; this alternative method is depicted in FIG. 7. The transfer molding process step depicted in FIG. 7 employs a deformable seal film 701 on the inner wall of the top mold 401a. Preferably, this film includes a plastic foil, preferably made of polyimide, between about 5 μm and 10 μm thick laminated with an adhering metal foil, also between about 5 μm and 10 μm thick. Preferred metals include noble metals such as palladium and silver; other suitable choices include copper, nickel, tin and other metals and compounds with no or very low oxidation tendency. Film 701 is oriented so that the plastic foil faces the device and the metal foil faces the top mold half. Since the metal of seal film takes the place of the deposited metal layer discussed in the previous method, this metal of the foil is also referred to herein as first metal.

The top half 401a of the mold has been designed to create on the substrate (leadframe) a ridge (designated 130 in FIG. 1) surrounding the MEMS elements and having a height greater than the height of the MEMS elements. As FIG. 7 shows, seal film 701 is stretched continuously between the reels 710 and lines the complete inner surface of mold top 401a. However, seal film 701 is non-adhering to the steel of the top mold. On the other hand, seal film 701 will be adhering to the particle-filled resin of the molding compound. As shown in FIG. 4, the cavity of the mold, loaded with the chip assembled on the substrate, is connected by a runner with the chamber of the mold for the molding compounds.

The next process steps are analogous to the steps depicted in FIG. 4. The heated pressure chamber of the mold is loaded with a solid pellet of a packaging compound including a polymerizable resin and filler particles. The mold is closed and the compound is pressured through the runner into the mold cavity, where it progresses as a controlled front through the cavity. On its way, the compound encapsulates the wires 120, forms the ridge 130, and adhesively contacts the seal film 701.

In the next process step, the mold is opened, whereby the top half 401a is separated from the seal film 701, which continues to adhere to the surfaces 130a and 130b of ridge 130. Thereafter, the seal film 701 is patterned by removing (preferably with an etching technique) any excess film portions beyond the ridge top 130b, including the portions remote from the MEMS elements as well as the portions 701a encapsulating the protective material 114 of the MEMS elements. The metal foil of film 701 remains in contact with metal ring 113 surrounding the MEMS elements.

Figure 8:
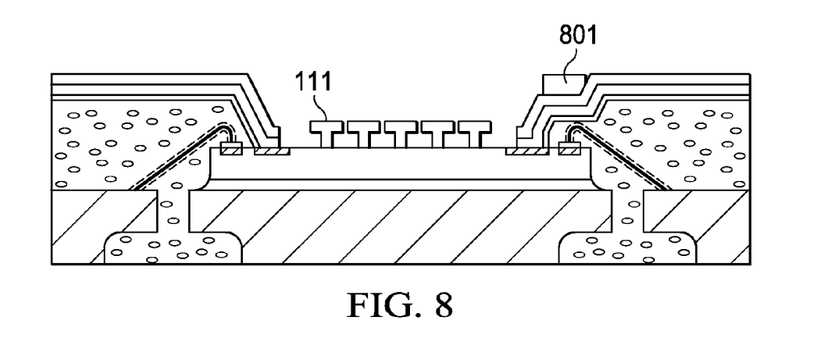

In next process steps, summarized in FIG. 8, the protective material 114 (for instance photoresist), which was shielding MEMS elements 111 throughout preceding process steps, is removed, thus releasing the elements, and some getter or lube material 801 may be dispensed in the proximity of the elements.

Figure 9:
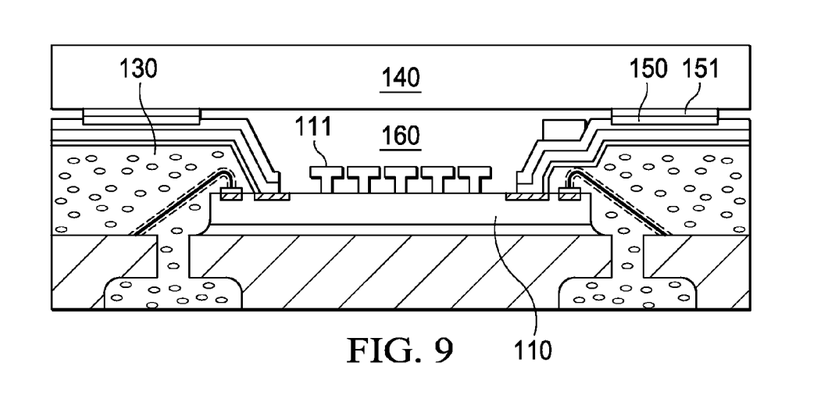

FIG. 9 illustrates the process steps of the liquid phase method. A stripe 150 of a layer made of a second metal is deposited onto the metalized layer 133 on the ridge top; as discussed above, the ridge top of covered with a layer 133 of a first metal. The stripe is configured to surround the MEMS micromechanical elements 111 at a distance and has a width; the second metal is selected from a group including gold, silver, and tin, and titanium.

Next, a lid 140 is provided, which is impervious to water molecules and has a size sufficient to cover the second metal stripe and the area surrounded by the second metal stripe; the lid can thus function as a cover for the MEMS device. Lid 140 may be shaped as a flat plate with a thickness between about 0.4 and 0.7 mm, as shown in FIG. 9, or it may be shaped as a dome or any other configuration as a cover for the MEMS device. Dependent on the type and functionality of the MEMS device, lid 140 may be selected from a group including glass, quartz, and silicon, and a plurality of metals and ceramics. Glass is particularly appropriate for DMD-type MEMS device.

In the next process step, a layer 151 of a third metal is deposited on the lid surface facing the ridge; the third metal layer is configured as a stripe matching the outline of the second metal stripe, but preferably has a width smaller than the width of the second metal stripe. The third metal is selected from a group including indium, gold and copper. The intent is to form, together with a selected second metal, binary systems such as indium/gold; gold/tin; copper/tin, and indium/tin. These binary systems form their first eutectic at a relatively low temperature, while the resulting intermetallic compounds need a considerably higher temperature for re-melting.

In the next process step, the lid and the substrate are aligned to bring the third metal layer into contact with the second metal layer along the entire stripe. Then thermal energy is applied to dissolve the third metal into the second metal layer and form intermetallic compounds adhering the lid and the ridge and establishing a hermetic bond. In a favored binary combination, the second metal is gold as a representative of metals with a melting temperature >400° C. and the third metal is indium as a representative of metals with a melting temperature <260° C., while the gold-indium intermetallic compounds have a melting temperature >400° C. Details of using this binary combination, favored for bonding at low melting temperature and reflowing at high temperature, are disclosed in U.S. application Ser. No. 13/67,734, filed 8 Nov. 2012, and U.S. application Ser. No. 13/840,688, filed 15 Mar. 2013, the entireties of both of which are incorporated herein by reference.

With the metallic bond between layers 150 and 151 completed, the volume enclosed by lid 140, chip 110, and metalized ridge 130 is sealed as a hermetic space 160 for the MEMS mechanical elements 111. As mentioned above in conjunction with FIGS. 2A and 2B, an analogous hermetic space can be reached for devices with substrates based on laminates or tapes, instead of leadframe-based substrates. When substrates are applied in strip form for batch processing, the final process step includes singulation of discrete units.

The substrate material used for supporting the MEMS mechanical elements may include any material that is usable for circuit components in integrated circuit manufacture. This includes a variety of semiconductor components, as well as a variety of non-semiconductor components.

For some MEMS devices, the metallization of the plastic ridge may be supported, when the fillers of the plastic resin are not randomly distributed, but exhibit a preference of orientation. Such imposed orientation may be achieved by an outside magnetic field, when at least a subset of the fillers is made of magnetically responding materials. The bonding wires may be electrically insulated by using skins made of polymeric sheaths.

The bond of the lid to the metalized ridge may be formed by intermetallic compounds of binary metal systems, or by intermetallic compounds of ternary or higher metal systems.

Those skilled in the art will appreciate that many other modifications may be made to the described example embodiments, and also that many other embodiments are possible, within the scope of the claimed invention.

What is claimed is:

1. A method of packaging a microelectromechanical system (MEMS) device, comprising:
   providing a MEMS device chip on a pad of a leadframe substrate and connected with conductive bonding wires extending from the chip to the leads, the chip having a micromechanical element extending a first height above an upper surface of the chip;
   molding on the substrate a ridge surrounding the micromechanical element and enclosing the leads, the ridge having a second height above the surface greater than the first height, the molding process using a compound comprising a polymerizable resin and metal filler particles;
   depositing a moisture-impermeable seal layer over an upper surface of the ridge and over downwardly extending surfaces of the ridge surrounding and facing the micromechanical element, and joining the upper surface of the chip with a moisture-proof juncture spaced from and continuously surrounding the micromechanical element; and
   bonding a moisture impervious lid to the upper surface of the ridge, spaced above and continuously surrounding the micromechanical element with a moisture-proof bond, thereby enclosing the micromechanical in a moisture-sealed volume defined by facing surfaces of the lid, the chip upper surface, and the seal layer over the downwardly extending ridge surfaces.

2. The method of claim 1, wherein the MEMS device chip is provided having a layer of sacrificial material covering the micromechanical element, and wherein the method further comprises removing the layer of sacrificial material following depositing the moisture-impermeable seal layer.

3. The method of claim 2, wherein depositing the seal layer comprises depositing a moisture impermeable film over the ridge upper and downwardly extending surfaces including over the layer of sacrificial material; and wherein the film comprises at least one layer of soft plastic compound coated with at least one layer of metal.

4. The method of claim 3, the bonding wires being coated with at least a monolayer of insulating polymeric structure.

5. A method comprising the steps of:
   assembling a chip onto a pad of a substrate having leads, the chip including a micromechanical element of a first height above a surface of the chip;
   bonding wires from the chip to the leads;
   loading the substrate with the chip and wires into a heated cavity of a mold configured to create on the substrate a ridge surrounding the micromechanical element and enclosing the leads, the ridge having a top of a second height greater than the first height above the surface;
   loading a heated pressure chamber of the mold with a solid pellet of a packaging compound including a polymerizable resin and filler particles, the chamber connected to the cavity by a runner;
   closing the mold and pressuring the compound through the runner into the mold cavity to form the ridge and encapsulate the wires;
   after removing the substrate from the mold, activating compound of a ridge surface and depositing on the ridge a layer of a first metal impervious to water and adhering to the compound surface;
   depositing a stripe of a second metal layer onto the first metal on the ridge, the stripe configured to surround the micromechanical element at a spacing distance;
   providing an impervious lid sized to cover the second metal stripe and surround an area containing the micromechanical element defined by the second metal stripe and spacing distance;
   depositing a layer of a third metal on a lid surface facing the ridge, the third metal layer configured as a stripe matching the contour of the second metal stripe;
   aligning the lid and the substrate to bring the third metal layer into contact with the second metal layer along the entire stripe; and
   applying thermal energy to dissolve the third metal into the second metal layer by forming intermetallic compounds adhering the lid and the ridge, thereby sealing the volume enclosed by the lid, the chip, and the metalized ridge as a hermetic space containing the micromechanical element.

6. The method of claim 5, further including, after bonding the wires, dispensing an organic compound of heterocyclic molecules onto the wires and leads, thereby coating the wires and leads with an adsorbed layer of heterocyclic molecules.

7. The method of claim 6, wherein dispensing the organic compound includes dispensing a solution of a heterocyclic compound dissolved in ethanol, whereby a layer of molecules of the heterocyclic compound is adsorbed on wire and lead surfaces.

8. The method of claim 7, wherein the heterocyclic compound comprises a compound selected from a group consisting of pyrrole ($C_4H_5N_1$), pyrazole and imidazole ($C_3H_4N_2$), containing a five-membered di-unsaturated ring with two non-adjacent nitrogen atoms as part of the ring; triazole ($C_2H_3N_3$), containing a five-membered ring with three nitrogen atoms as part of the ring; pentazolde, thiazole, isothiazole, and their derivatives.

9. The method of claim 6, wherein the dispensing includes dispensing a semi-liquid insulating polymeric material, whereby an insulating film is adsorbed on wire and lead surfaces.

10. The method of claim 6, further including, after closing the mold, allowing resin molecules to spread from the chamber to the assembly inside the cavity during the time intervals needed to liquefy the pellet and to pressurize it through the mold runners into the cavity, utilizing the adsorbed heterocyclic molecules to cross-link the arriving resin molecules into at least a monolayer of insulating polymeric structure on the wire and lead surfaces.

11. The method of claim 6, wherein the step of activating the compound includes at least one of etching in concentrated acid, ion bombarding, or plasma discharging.

12. The method of claim 6, wherein the first metal is selected from a group consisting of palladium, tin, nickel and copper, and combinations thereof.

13. The method of claim 12, wherein the second metal is selected from a group consisting of gold, silver, and tin; and the third metal is selected from a group consisting of indium, gold, and copper.

\* \* \* \* \*